United States Patent
Vier et al.

(10) Patent No.: US 6,337,793 B1
(45) Date of Patent: Jan. 8, 2002

(54) APPARATUS AND METHOD FOR MOUNTING A PERIPHERAL DEVICE IN A COMPUTER SYSTEM

(75) Inventors: Bradford E. Vier; Roger A. Siedow, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/447,149

(22) Filed: Nov. 23, 1999

(51) Int. Cl.[7] .............................. G06F 1/16; H05K 7/14
(52) U.S. Cl. .................... 361/683; 361/685; 312/223.2; 312/326; 312/329
(58) Field of Search ................................. 361/685, 683, 361/724–727; 312/223.1, 223.2, 326, 327, 328, 329

(56) References Cited

U.S. PATENT DOCUMENTS

| | | |
|---|---|---|
| 4,979,909 A | 12/1990 | Andrews |
| 5,123,721 A | 6/1992 | Seo |
| 5,136,468 A | 8/1992 | Wong et al. |
| 5,277,615 A | 1/1994 | Hastings et al. |
| 5,306,079 A | 4/1994 | Liu |
| 5,513,068 A * | 4/1996 | Girard .......................... 361/685 |
| 5,564,804 A | 10/1996 | Gonzalez et al. |
| 5,572,402 A | 11/1996 | Jeong |
| 5,734,557 A | 3/1998 | McAnally et al. |
| 5,808,864 A | 9/1998 | Jung |
| 5,828,547 A | 10/1998 | Francovich et al. |
| 5,995,364 A * | 11/1999 | McAnally et al. .......... 361/685 |
| 6,018,457 A * | 1/2000 | Mroz .......................... 361/685 |
| 6,064,568 A * | 5/2000 | Schmitt ....................... 361/685 |
| 6,075,694 A * | 6/2000 | Mills et al. .................. 361/685 |
| 6,188,571 B1 * | 2/2001 | Roganti et al. ............. 361/685 |

* cited by examiner

Primary Examiner—Leo P. Picard
Assistant Examiner—Lisa Lea-Edmonds (57) ABSTRACT

A computer system including a chassis having two spaced apart walls, a transverse wall attached between the two spaced apart walls and a door pivotally attached to a first one of the two spaced apart walls. The door is movable between an open position and a closed position with respect to a second one of the two spaced apart walls. A first retaining pin is attached to the transverse wall. A second retaining pin is attached to the door. A mechanism is attached to the chassis for securing the door in the closed position. A peripheral device is mounted in the chassis. The first retaining pin is engaged with a first mounting hole in a first face of the peripheral device and the second mounting pin is engaged with a second hole in the second face of the peripheral device. The hinged or removable door allows the peripheral device to be cabled to the other components inside the computer before they are installed in the chassis. Cabling the peripheral device in the computer before it is securely mounted allows for easier access to the back of the peripheral drives where the cables are to be connected, resulting in faster and easier installation time.

21 Claims, 6 Drawing Sheets

APPARATUS AND METHOD FOR MOUNTING A PERIPHERAL DEVICE IN A COMPUTER SYSTEM

BACKGROUND

The disclosures herein relate generally to computer systems and more particularly to a system and method for mounting a peripheral device in a computer system.

Chassis with conventional hard drive mounting bays require the hard drive to be installed in the chassis before electronic cables can be attached to the hard drive. They also often require screws to be secured into the hard drive once it is positioned inside of the drive mounting bay. This type of mounting technique can result in a restricted and difficult assembly process. Furthermore, this type of mounting technique can adversely affect production cost due to assembly errors and greater assembly time.

Attempts have been made to simplify the drive mounting process by improving access to drive mounting hardware and cable connectors. Some mounting apparatus use removable drive bays. Other drive mounting apparatuses include mounting brackets that allow the drives to be slid and/or snapped into position.

U.S. Pat. No. 5,564,804 discloses a bracket for securing a computer drive within a housing. The housing has a base and two walls each disposed perpendicularly to the base and to each other. The bracket includes a base for supporting the computer drive. The base has an aperture for securing the bracket within the housing and for limiting movement of the bracket in a first degree of freedom. The bracket also includes a support means which is perpendicularly coupled to the base. The support means engages the first wall for limiting movement of the bracket in a second degree of freedom. A mechanism is coupled to the base for engaging the housing wall and for limiting movement of the bracket in a third degree of freedom.

U.S. Pat. No. 5,306,079 discloses a multi-purpose frame for a computer including floppy disk seats and hard disk seats. The front end of the frame is provided with side hooks, front hooks and a downward urging retainer. The side portion of the frame is provided with interface card hooks, and the rear lower portion thereof is provided with a pair of L-shaped strips. Each one of the hard disk seats is provided with fastening hooks and a resilient retainer, and one of the floppy disk seats is provided with dovetail grooves having a recess located therebetween. The frame facilitates the dismounting and replacing of the disk drives which may be conveniently mounted to or dismounted from the computer base.

U.S. Pat. No. 4,979,909 discloses an apparatus for removing mass storage devices (e.g. disk drives) from the internal support frame in a computer system. The apparatus includes a mass storage device having resilient, side-mounted engagement members adapted for receipt in openings through the side walls of the support frame to lock the device in position. To remove the device, a rotatable lever is connected to at least one side wall of the support frame. The lever includes at least one projection member positioned adjacent to the opening through the side wall to which the lever is connected. To remove the device from the support frame, the lever is rotated so that the projection member contacts the engagement member. Continued rotation of the lever causes the engagement member to be urged inwardly and out of the opening in the side wall. As a result, the device is unlocked from the frame.

Although attempts have been made to simplifying the mounting peripheral devices in a chassis of a computer, only limited success has been achieved. Accordingly, there is a need for an apparatus and method for quickly and economically mounting a peripheral device in the chassis of a computer system that overcomes the shortcomings of previous techniques.

SUMMARY

One embodiment, accordingly, provides a chassis configured to allow a cable to be connected to a peripheral device prior to installing the peripheral device in the chassis. To this end, one embodiment provides an apparatus for mounting a peripheral device in a computer including a chassis having two spaced apart walls and a transverse wall attached between the two spaced apart walls. A door is pivotally attached to a first one of the two spaced apart walls for being moved between an open position and a closed position with respect to a second one of the two spaced apart walls. A first peripheral device retaining member is attached to the transverse wall. A second peripheral device retaining member is attached to the door. A mechanism is provided for securing the door in the closed position.

A principal advantage of this embodiment is that access to the back of the peripheral device is enhanced for simplifying attachment of the associated cabling to the peripheral device, permitting faster installation time.

DETAILED DESCRIPTION

Figure 1:
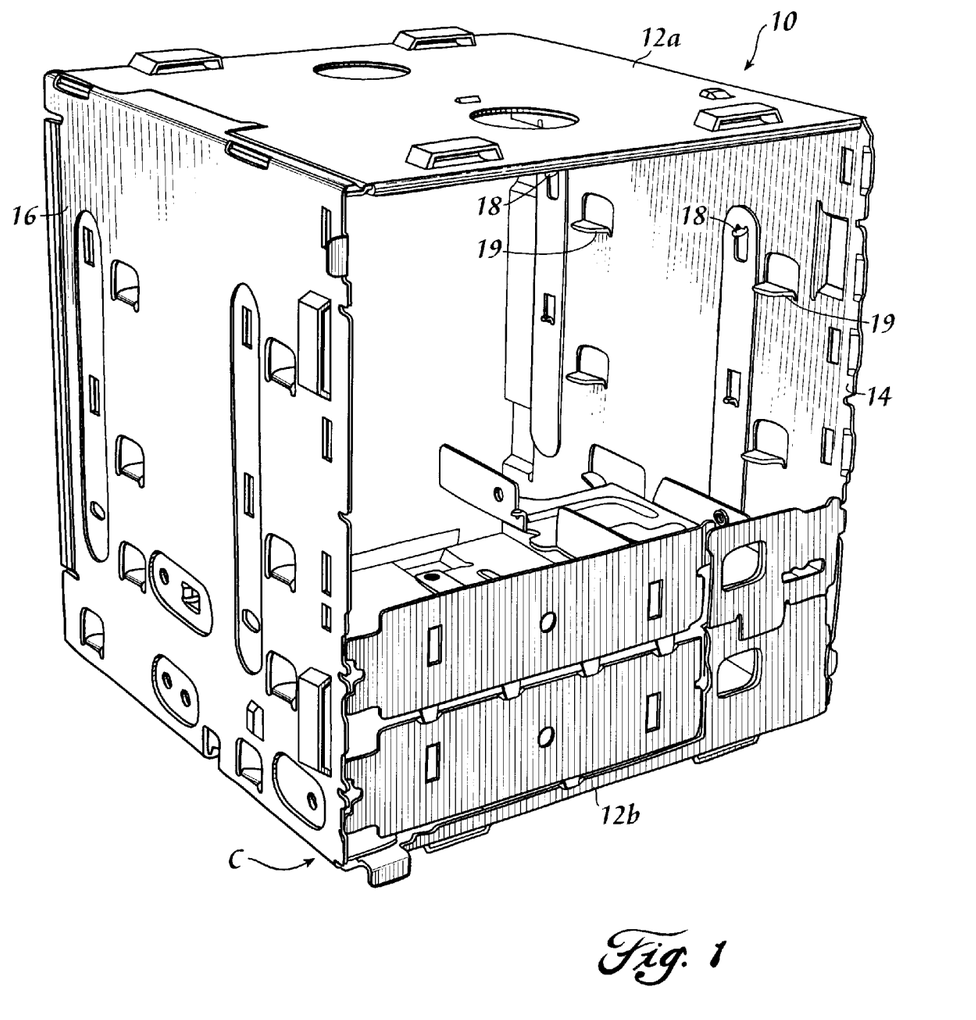
FIG. 1 is a perspective view illustrating an embodiment of a chassis having a removable door in a closed position.
Figure 2:
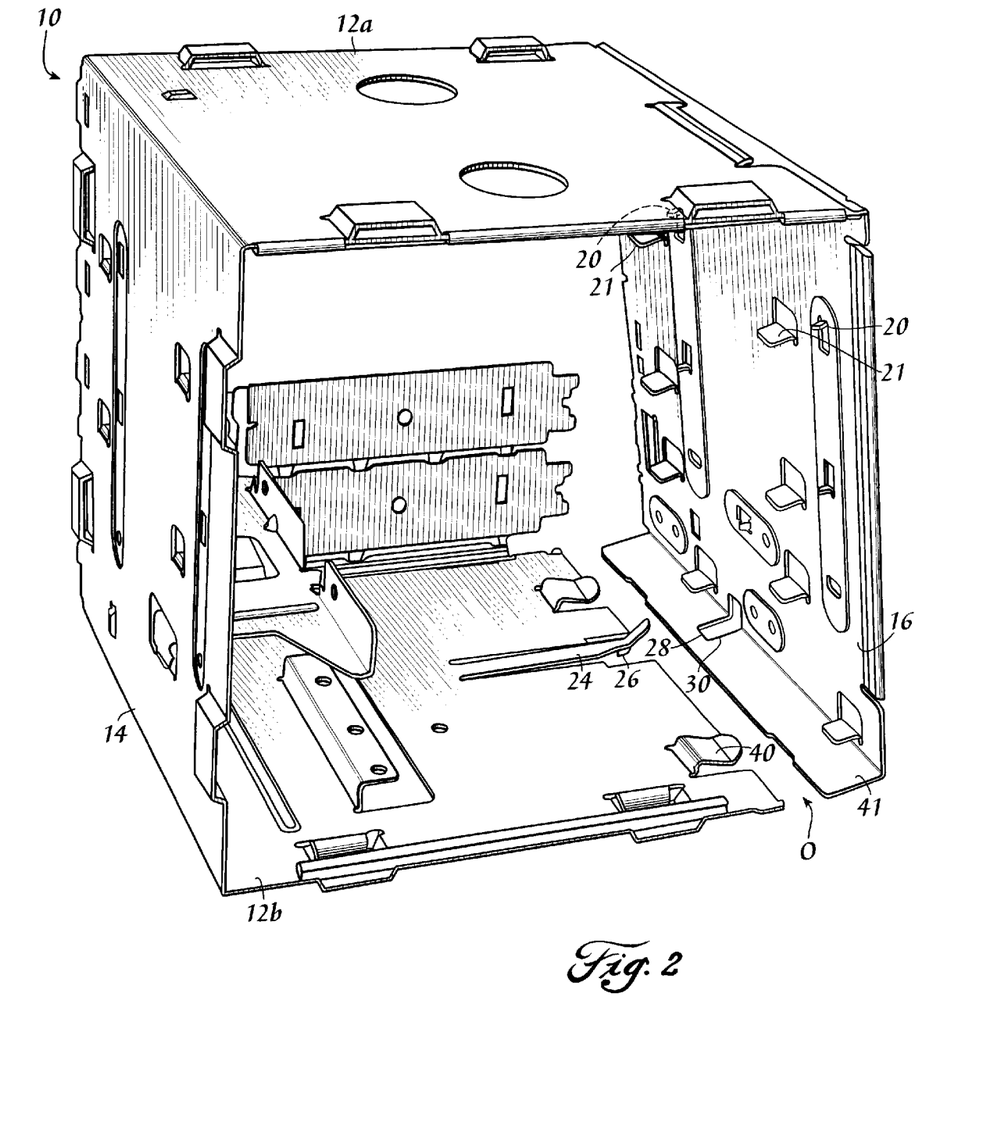
FIG. 2 is a perspective view illustrating an embodiment of the chassis with the door in an open position.

An embodiment of a chassis 10 is illustrated in FIGS. 1 and 2. The chassis includes two spaced apart walls 12a, 12b and a transverse wall 14 attached between the two spaced apart walls 12a, 12b. A door 16 is pivotally attached to a first one 12a of the two spaced apart walls for being moved between a closed position C, FIG. 1, and an open position O, FIG. 2, with respect to a second one of the two spaced apart walls 12.

The chassis 10 is preferably made from sheet metal using processes such as sheet metal forming and stamping. The two spaced apart walls 12a, 12b and the transverse wall 14 may be integrally formed or separately formed and then attached by a method such as spot welding. The chassis 10 may be a drive bay chassis (shown) that is attached to a system chassis or a system chassis including an integral drive bay portion.

A plurality of first retaining members 18 and a plurality of first support flanges 19, FIG. 1, are attached to the transverse wall 14. A plurality of second retaining members 20 and a plurality of second support flanges 21, FIG. 2, are attached to the door 16. The first retaining members 18 and the first support flanges 19 extend from the transverse wall 14 toward the door 16. The second retaining members 20 and the second support flanges 21 extend from the door 16 toward the transverse wall 14 when the door is in the closed position C. The first retaining members 18 and the first support flanges 19 may be integrally formed with the transverse wall 14. The second retaining members 20 and the second support flanges 21 may be integrally formed with the door 16.

A latch member 24, FIG. 2, is resiliently attached to the second one 12b of the two spaced apart walls. The latch member 24 includes a catch portion 26 that engages an edge 28 of an opening 30 formed in the door 16 when the door is in the closed position C. The latch member 24 is movable between a latched position and a release position for enabling the catch portion 26 to be released from the edge 28 of the opening 30 so that the door 16 can be moved from the closed position C to the open position O.

Figure 3:
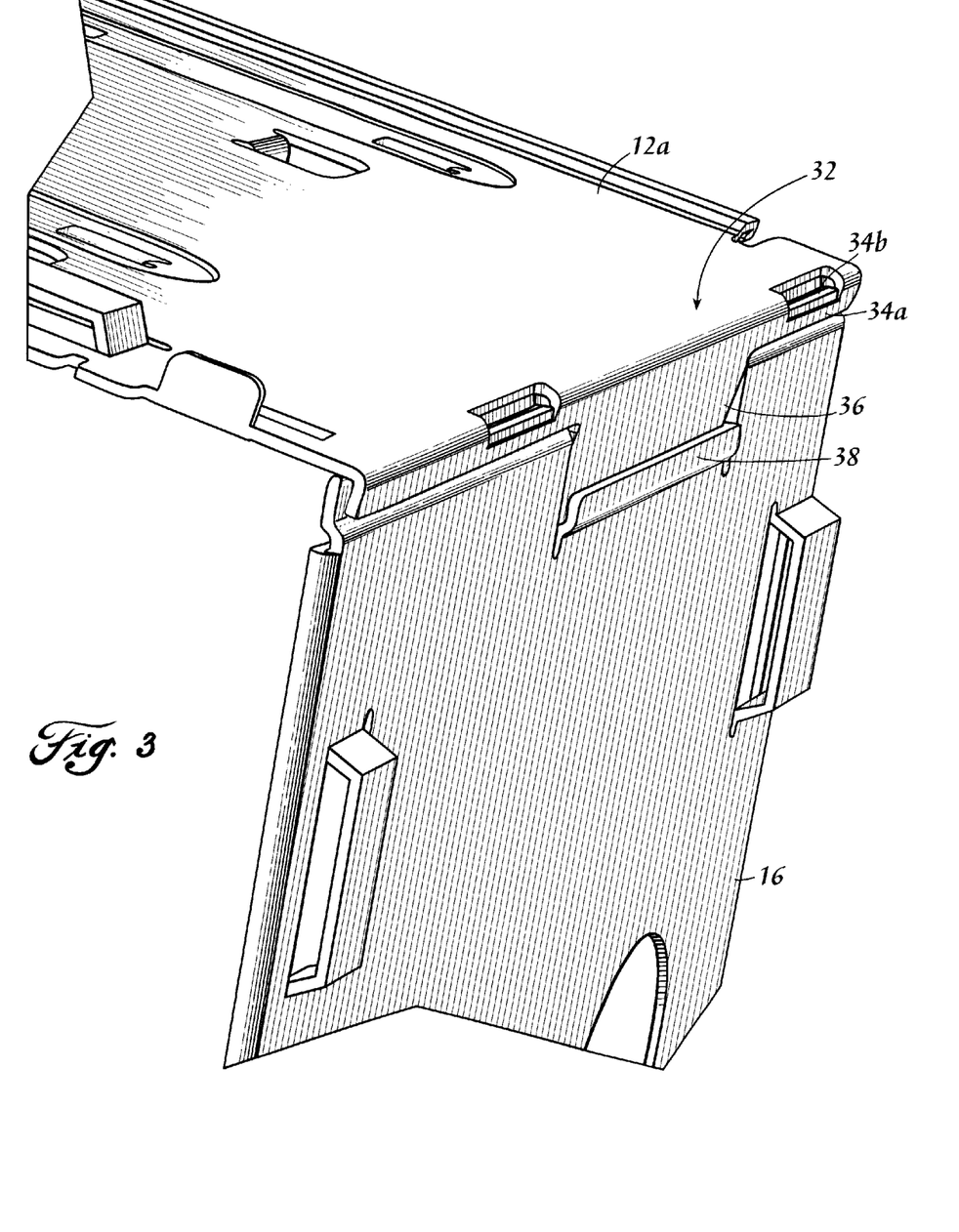
FIG. 3 is a fragmented perspective view illustrating an embodiment of a hinge assembly.

As illustrated in FIG. 3, the door 16 is pivotally attached to the first one 12a of the two spaced apart walls by a hinge assembly 32. The hinge assembly 32 includes a first pivot portion 34a attached to the door 16 that is pivotally attached to a second pivot portion 34b that is attached to the first one 12a of the two spaced apart walls. The first pivot portion 34a is configured to be detachable from the second pivot portion 34b when the door is in the open position O. The hinge assembly also includes a positioning member 36 attached to the first one 12a of the two spaced walls and a positioning flange 38 attached to the door 16. The positioning flange 38 engages the positioning member 36 for positioning the door in the appropriate location when the door 16 is moved to the closed position C.

A plurality of alignment tabs 40, FIG. 2, may be provided for ensuring accurate placement of the door 16 when it is in the closed position C. The alignment tabs 40 are attached to the chassis 10 and the flange 41 is attached to the door 16. The alignment tabs 40 engage the flange 41 when the door 16 is moved to the closed position C.

Figure 4:
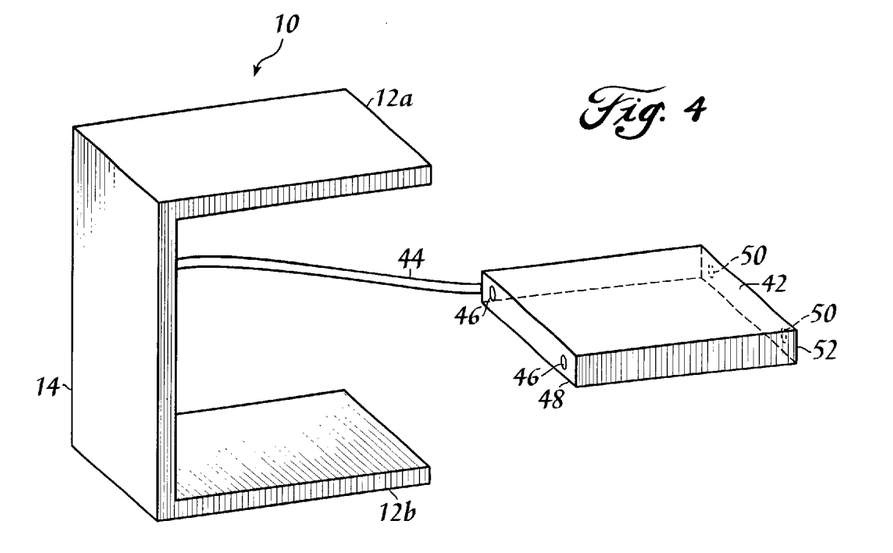
FIG. 4 is a fragmented perspective view illustrating a cable attached to a peripheral device.

Referring now to FIGS. 4–7, a peripheral device 42 such as a hard disk drive, a compact disc drive, etc. is mountable in the chassis 10. The peripheral device 42 includes a plurality of first mounting holes 46 in a first face 48 and a plurality of second mounting holes 50 in a second face 52. As illustrated in FIG. 4, a cable 44 is attached to the peripheral device 42 with the door 16 detached from the chassis 10.

Figure 5:
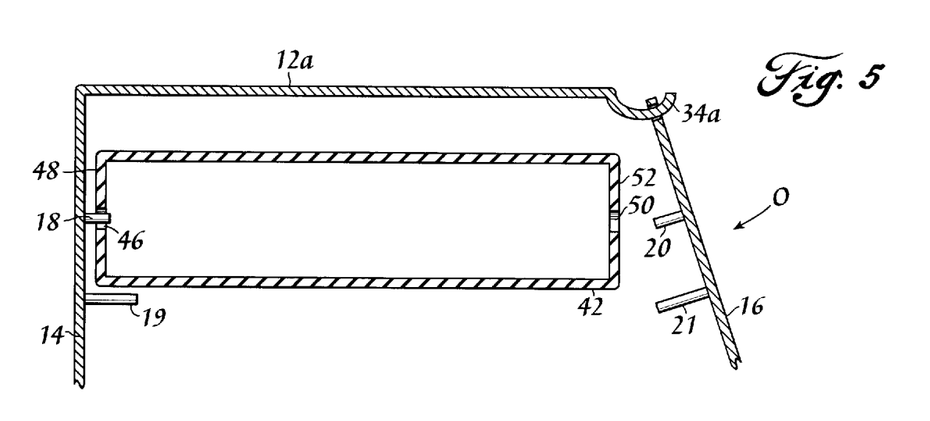
FIG. 5 is a fragmented cross sectional view illustrating an embodiment of the peripheral device mounted in the chassis with the door removed.

The peripheral device 42 is then positioned in the chassis 10 adjacent to the transverse wall 14, FIG. 5. Each one of the first retaining pins 18 engage the corresponding first mounting holes 46 formed in the first face 48. The door 16 is then attached to the chassis 10 by engaging the second pivot portion 34b with the first pivot portion 34a with the door 16 in the open position O.

Figure 6:
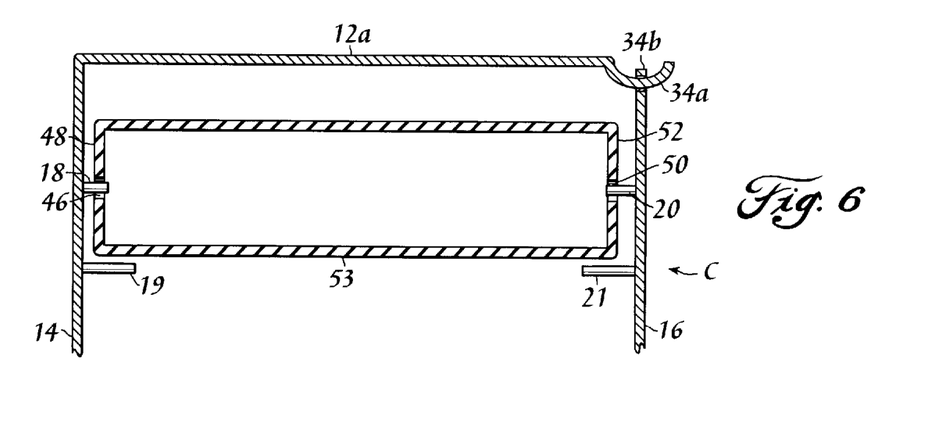
FIG. 6 is a fragmented cross sectional view illustrating an embodiment of the peripheral device mounted in the chassis with the door secured in the closed position.
Figure 7:
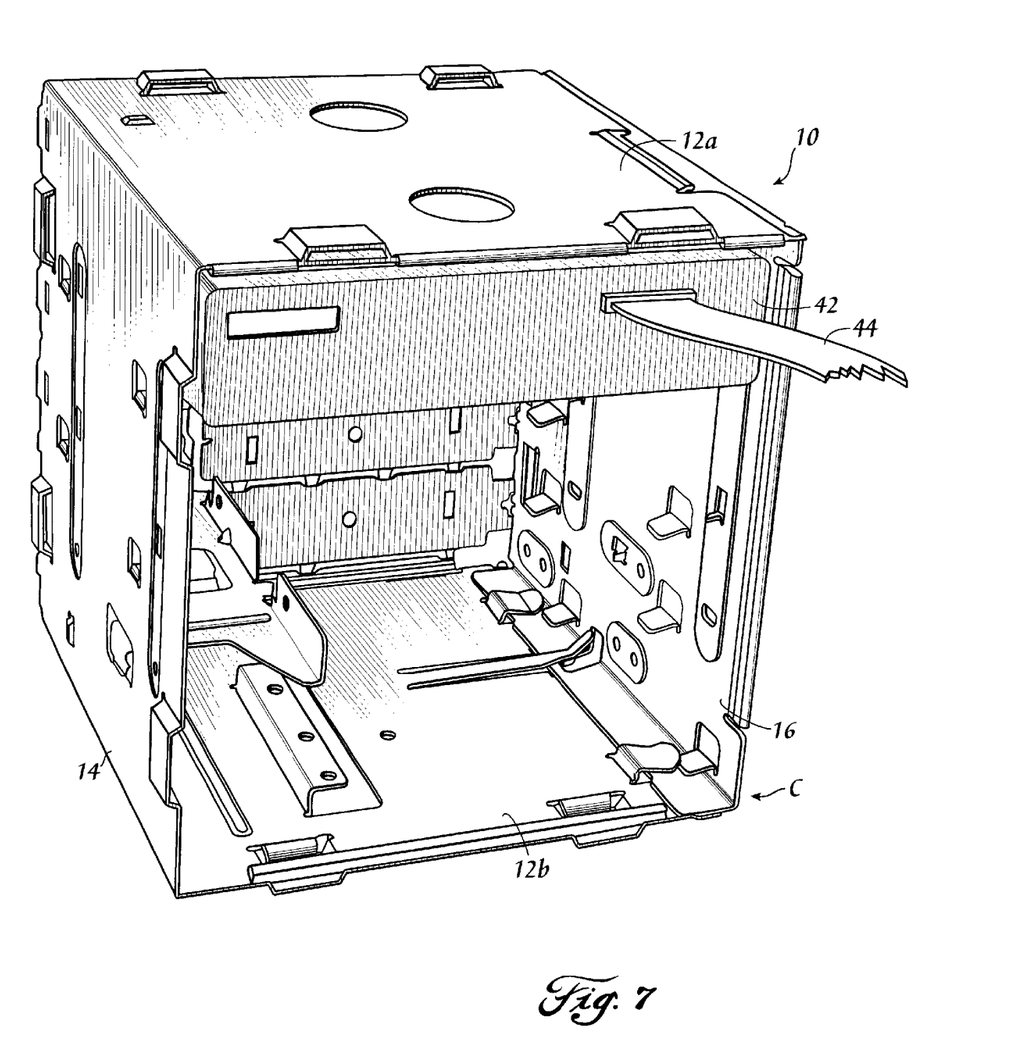
FIG. 7 is a perspective view illustrating the peripheral device mounted in the chassis.

As illustrated in FIGS. 6 and 7, the door 16 is then moved to the closed position C. With the door 16 in the closed position C, each one of the second retaining members 18 engage the corresponding second mounting holes 50 formed in the second face 52 of the peripheral device 42. The first and second support flanges 19, 21 are positioned adjacent to a third face 53 of the peripheral device 42 for providing additional support in instances when inertial loadings of the peripheral device 20 cause the retaining members 18 and 20 to deflect.

Figure 8:
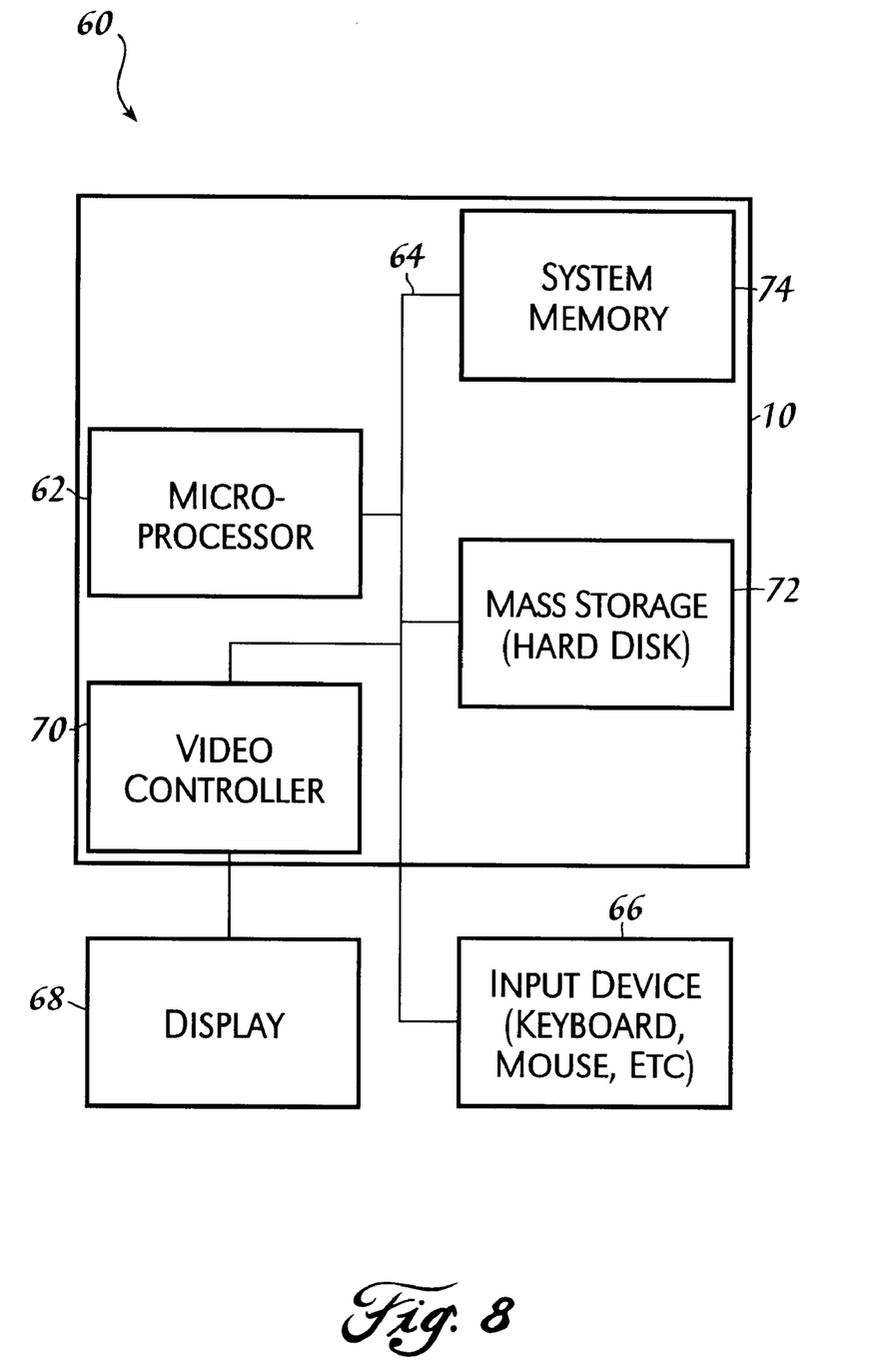
FIG. 8 is a perspective view illustrating an embodiment of a computer system.

An embodiment of a computer system 60 is illustrated in FIG. 8. The computer system 60 includes at least one microprocessor 62. The microprocessor 62 is connected to a signal bus 64. The signal bus 64 serves as a connection between the microprocessor 62 and other components of the computer system 60. One or more input devices 66 may be coupled to the microprocessor 62 to provide input to the microprocessor 62. Examples of input devices include keyboards, touchscreens, and pointing devices such as a mouse, a trackball and a trackpad. The computer system 60 may also include a display 68 which is coupled to the microprocessor 62 typically by a video controller 70. Programs and data are stored on a mass storage device 72 which is coupled to the microprocessor 62. Mass storage devices include components such as hard disks, optical disks, magneto-optical drives, floppy drives, and the like. A system memory 74 provides the microprocessor 62 with fast storage to facilitate execution of computer programs by the microprocessor 62. At least a portion of the components of the computer system 10 are typically mounted in an enclosure such as the chassis 10. It should be understood that other busses and intermediate circuits can be employed between the components described above and microprocessor 62 to facilitate interconnection between the components and the microprocessor 62.

One embodiment provides an apparatus for mounting a peripheral device in a computer. The apparatus includes a chassis having two spaced apart walls and a transverse wall attached between the two spaced apart walls. A door is pivotally attached to a first one of the two spaced apart walls for being moved between an open position and a closed position with respect to a second one of the two spaced apart walls. A first peripheral device retaining member is attached to the transverse wall. A second peripheral device retaining member is attached to the door. A mechanism is provided for securing the door in the closed position.

Another embodiment provides a computer system including a chassis having two spaced apart walls, a transverse wall attached between the two spaced apart walls and a door pivotally attached to a first one of the two spaced apart walls for being moved between an open position and a closed position with respect to a second one of the two spaced apart walls. A first retaining pin is attached to the transverse wall. A second retaining pin is attached to the door. A mechanism is attached to the chassis for securing the door in the closed position. A microprocessor is mounted in the chassis and an input is coupled to the microprocessor to provide input to the microprocessor. A peripheral device is mounted in the chassis and coupled to the microprocessor for storing information. The first retaining pin is engaged with a first mounting hole in a first face of the peripheral device and the second mounting pin is engaged with a second hole in the second face of the peripheral device. A display is coupled to the microprocessor by a video controller. Memory is coupled to the microprocessor to provide storage to facilitate execution of computer programs by the microprocessor.

A further embodiment provides a method of mounting a peripheral device in a computer system. The method includes providing a chassis including two spaced apart walls, a transverse wall attached between the two spaced apart walls and a first retaining pin attached to the transverse wall. The peripheral device is positioned in the chassis with the first retaining pin engaging a first mounting hole formed in a first face of the peripheral device. A door is then pivotally attached to a first one of the two spaced apart walls for being moved between an open position and a closed position with respect to a second one of the two spaced apart walls. The door is moved from the open position to the closed position. In response to moving the door from the open position to the closed position, a second retaining pin attached to the door is engaged in a second mounting hole formed in a second face of the peripheral device. The door is then secured in the closed position.

As it can be seen, the embodiments presented herein provide several advantages. A chassis having a peripheral device mounting bay including a hinged or removable wall allows a peripheral device to be cabled to the other components outside of the computer before it is installed in the chassis. Cabling the peripheral device in the computer before it is mounted in the chassis allows for easier access to the back of the peripheral drives where the cables are to be connected. This results in faster installation time and fewer damaged parts due to errors when plugging in connectors. A hinged drive bay with positioning pins eliminates the need for screws to secure each peripheral device in the chassis. By eliminating the screws, assembly time is reduced, the potential for damaging the peripheral device is reduced, and the cost associated with the screws is eliminated. The use of a mechanical latching mechanism allows the hinged wall to be quickly and easily secured in a closed position or released for being moved to an open position.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for mounting a peripheral device in a computer, comprising:
    a chassis including two spaced apart walls and a transverse wall attached between the two spaced apart walls;
    a door pivotally attached to a first one of the two spaced apart walls for being moved between an open position and a closed position with respect to a second one of the two spaced apart walls;
    a first peripheral device retaining member attached to the transverse wall;
    a second peripheral device retaining member attached to the door; and
    means for securing the door in the closed position.

2. The apparatus of claim 1 wherein the means for securing includes a latch assembly having a first portion attached to the door and a second portion attached to one of the two spaced apart walls.

3. The apparatus of claim 1 wherein the means for securing includes an opening formed in the door and a latch member resiliently attached to the second one of the two spaced apart walls, the latch member including a catch portion for engaging an edge of the opening when door is in the closed position.

4. The apparatus of claim 1 wherein the first and the second peripheral device retaining members are pins, the first pin extending from the transverse wall toward the door and the second pin extending from the door toward the transverse wall.

5. The apparatus of claim 1 further comprising a first support flange attached to the transverse wall and a second support flange attached to the door, the first support flange extending from the transverse wall toward the door and the second support flange extending from the door toward the transverse wall.

6. The apparatus of claim 1 further comprising a hinge, a first portion of the hinge attached to the door and a second portion of the hinge attached to the first one of the two spaced apart walls.

7. The apparatus of claim 6 wherein the first portion of the hinge is detachable from the second portion of the hinge when the door is in the open position.

8. The apparatus of claim 1 wherein the two spaced apart walls and the transverse wall are integrally formed.

9. The apparatus of claim 1 further comprising an alignment tab attached to the second one of the two spaced apart walls and a flange attached to the door, the flange being engaged by the alignment tab when the door is in the closed position.

10. A computer system, comprising:
    a chassis including two spaced apart walls, a transverse wall attached between the two spaced apart walls and a door pivotally attached to a first one of the two spaced apart walls for being moved between an open position and a closed position with respect to a second one of the two spaced apart walls;
    a first retaining pin attached to the transverse wall;
    a second retaining pin attached to the door;
    means for securing the door in the closed position;
    a microprocessor mounted in the chassis;
    an input coupled to the microprocessor to provide input to the microprocessor;
    a peripheral device mounted in the chassis and coupled to the microprocessor for storing information, the first retaining pin engaging a first mounting hole in a first face of the peripheral device and the second mounting pin engaging a second hole in a second face of the peripheral device;
    a display coupled to the microprocessor by a video controller; and
    memory coupled to the microprocessor to provide storage to facilitate execution of computer programs by the microprocessor.

11. The computer system of claim 10 wherein the means for securing includes a latch assembly having a first portion attached to the door and a second portion attached to one of the two spaced apart walls.

12. The computer system of claim 10 wherein the means for securing includes an opening formed in the door and a latch member resiliently attached to the second one of the two spaced apart walls, the latch member including a catch portion for engaging an edge of the opening when door is in the closed position.

13. The computer system of claim 10 further comprising a first support flange attached to the transverse wall and a second support flange attached to the door, the first support flange engaging the peripheral device adjacent to the first face thereof and the second support flange engaging the peripheral device adjacent to the second face thereof.

14. The computer system of claim 10 further comprising a hinge, a first portion of the hinge attached to the door and a second portion of the hinge attached to the first one of the two spaced apart walls.

15. The computer system of claim 14 wherein the first portion of the hinge is detachable from the second portion of the hinge when the door is in the open position.

16. The computer system of claim 10 wherein the two spaced apart walls and the transverse wall are integrally formed.

17. The computer system of claim 10 further comprising an alignment tab attached to the second one of the two spaced apart walls and a flange attached to the door, the flange being engaged by the alignment tab when the door is in the closed position.

18. A method of mounting a peripheral device in a computer system, comprising the steps of:

providing a chassis including two spaced apart walls, a transverse wall attached between the two spaced apart walls and a first retaining pin attached to the transverse wall;

mounting a peripheral device in the chassis;

engaging the first retaining pin with a first mounting hole formed in a first face of the peripheral device;

pivotally attaching a door to a first one of the two spaced apart walls for being moved between an open position and a closed position with respect to a second one of the two spaced apart walls, the door including a second retaining pin attached thereto;

moving the door from the open position to the closed position for engaging the second retaining pin in a second mounting hole formed in a second face of the peripheral device; and securing the door in the closed position.

19. The method of claim 18 wherein the step of securing the door in the closed position includes the step of attaching a latch member to the second one of the spaced apart walls.

20. The method of claim 19 wherein the step of securing the door in the closed position includes the step of providing an opening in the door for engagement with the latch member.

21. The method of claim 18 further comprising the step of attaching a cable to the peripheral device before the first retaining pin is engaged with the first mounting hole.

* * * * *